(12) United States Patent
Kikuchi

(10) Patent No.: US 6,646,312 B1
(45) Date of Patent: Nov. 11, 2003

(54) SEMICONDUCTOR MEMORY DEVICE WITH BIT LINES HAVING REDUCED CROSS-TALK

(75) Inventor: Hidekazu Kikuchi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/628,044

(22) Filed: Jul. 28, 2000

(65) Prior Publication Data (65)

(51) Int. Cl.⁷ .............................................. H01L 29/76
(52) U.S. Cl. ....................................... 257/390; 257/211
(58) Field of Search ................................. 257/391, 390, 257/316, 315, 203, 332, 321, 211

(56) References Cited

U.S. PATENT DOCUMENTS

| 4,287,571 A | * | 9/1981 | Chakravarti et al. |
| 4,707,718 A | * | 11/1987 | Sakai et al. |
| 5,434,814 A | * | 7/1995 | Cho et al. |
| 5,731,238 A | * | 3/1998 | Cavins et al. |
| 5,917,224 A | * | 6/1999 | Zangara |
| 5,959,877 A | * | 9/1999 | Takahashi |
| 6,243,284 B1 | * | 6/2001 | Kumagai |

FOREIGN PATENT DOCUMENTS

| JP | 05251660 | 9/1993 |
| JP | 08069699 | 3/1996 |
| JP | 08204159 | 8/1996 |
| JP | 11328967 | 11/1999 |

OTHER PUBLICATIONS

Wolf, "Silicon Processing for the VLSI Era, vol. 2—Process Integration," 1990, Lattice Press, p. 194–196.*
Wolf, "Silicon Processing for the VLSI Era, vol. 2—Process Integration," 1990, Lattice Press, p. 274.*
Wolf, "Silicon Processing for the VLSI Era, vol. 2—Process Integration," 1990, Lattice Press, p. 191 and 273.*

* cited by examiner

Primary Examiner—Nathan J. Flynn
Assistant Examiner—Kevin Quinto
(74) Attorney, Agent, or Firm—Volentine Francos, PLLC

(57) ABSTRACT

A semiconductor memory device is fabricated to have a multi-layered structure on a semiconductor substrate. The semiconductor memory device includes ground lines, which are formed in a first conductive layer; bit lines, which are formed in a second conductive layer; and word lines, which are formed in a third conductive layer. The bit lines are not formed in the uppermost conductive layer.

9 Claims, 7 Drawing Sheets

SEMICONDUCTOR MEMORY DEVICE WITH BIT LINES HAVING REDUCED CROSS-TALK

TECHNICAL FIELD OF THE INVENTION

The present invention relates to a semiconductor memory device, such as a mask ROM (Read-Only Memory) and a method for fabricating the same.

BACKGROUND OF THE INVENTION

As a higher degree of integration is realized for LSIs, parasitic capacitance between two adjacent conductive lines is remarkably increased; and therefore a cross-talk noise is increased in LSIs. Such a cross-talk noise is critical to a memory device, such as a ROM (Read-Only Memory).

A ROM stores a large amount of data, which are read out when necessary. There is a demand for a higher degree of integration to such a ROM. In a ROM, each memory cell block includes memory cells arrayed in a matrix configuration. Each memory cell is constituted by MOS transistors. These MOS transistors are connected at gate electrodes to word lines, which are extended in a first direction. One of the source or drain regions of the MOS transistors are connected to bit lines, which are extended in a second direction orthogonal to the first direction.

When parasitic capacitance between adjacent two bit lines is increased, an operation error may be made due to a cross-talk noise.

OBJECTS OF THE INVENTION

Accordingly, an object of the present invention is to provide a semiconductor memory device that contributes to reduce affection of a cross-talk noise due to parasitic capacitance between adjacent two bit lines.

Another object of the present invention is to provide a method for fabricating a semiconductor memory device that contributes to reduce affection of a cross-talk noise due to parasitic capacitance between adjacent two bit lines.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor memory device is fabricated to have a multi-layered structure on a semiconductor substrate. The semiconductor memory device includes ground lines, which are formed in a first conductive layer; bit lines, which are formed in a second conductive layer; and word lines, which are formed in a third conductive layer. The bit lines are not formed in the uppermost conductive layer.

According to a second aspect of the present invention, a semiconductor memory device is fabricated to have a multi-layered structure on a semiconductor substrate. In the method, a first conductive layer for ground lines is provided; a second conductive layer for bit lines is provided; and a third conductive layer for word lines is provided. The bit lines are not provided in the uppermost conductive layer.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
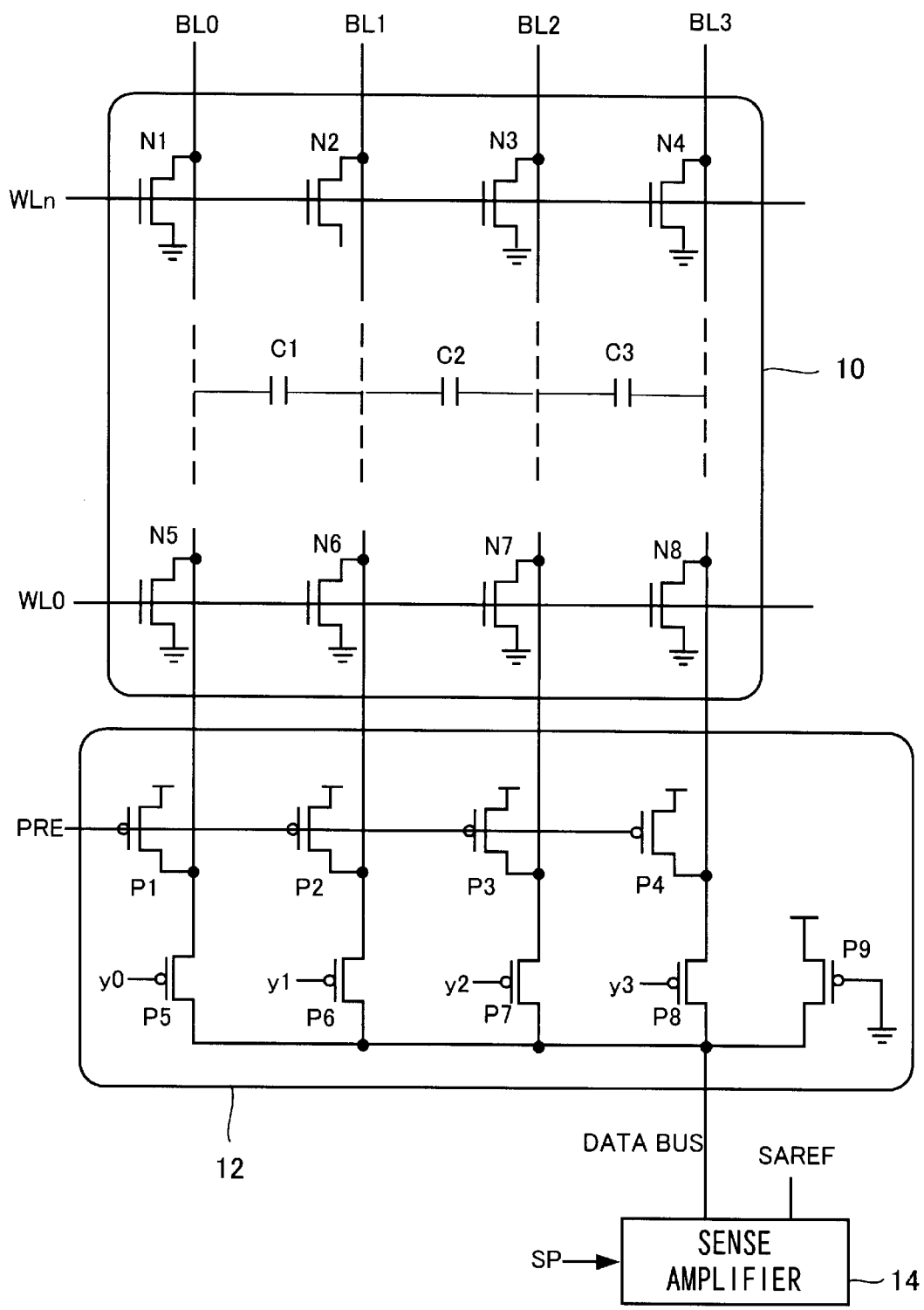
FIG. 1 is a circuit diagram showing a mask ROM according to a preferred embodiment of the present invention.

FIG. 1 shows a mask ROM according to a preferred embodiment of the present invention. The mask ROM includes a memory cell array 10, selector circuit 12 and a sense amplifier 14. The memory cell array 10 includes memory cells, which are arrayed in a matrix configuration. Each memory cell is constituted by an n-channel MOS transistor N1–N8. The threshold value of each MOS transistor N1–N8 is selectively adjusted or programmed to a higher threshold voltage or a lower threshold voltage as a function of the programmed data.

Gate electrodes of the MOS transistors N1–N4 are connected to a word line WLn, while gate electrodes of the MOS transistors N5–N8 are connected to a word line WL0. The word lines WL0 to WLn are arranged to extend in the horizontal direction in the drawing. Drains of the MOS transistors N1 and N5 are connected to a bit line BL0; drains of the MOS transistors N2 and N6 are connected to a bit line BL1; drains of the MOS transistors N3 and N7 are connected to a bit line BL2; and drains of the MOS transistors N4 and N8 are connected to a bit line BL3. The bit lines BL1 to BL3 are arranged to extend in the vertical direction in the drawing.

The MOS transistors N1 and N3–N8 are connected at sources to the ground to store a low level of data, while the MOS transistor N2 is floated at a source to store a high level of data.

The selector circuit 12 includes PMOS transistors P1 to P9. The PMOS transistors P1 to P4 are applied at gates with pre-charge voltage. The PMOS transistors P1 to P4 are connected at sources to a power supply line (Vdd); and at drains to the bit lines BL0 to BL3, respectively. The PMOS transistors P5 to P8 are applied at gates with Y-decode signals y0 to y3, respectively. The PMOS transistors P5 to P8 are connected at sources to the bit lines BL0 to BL3, respectively; and at drains to a data bus (DB). The PMOS transistor P9 is connected at a gate to the ground, at a source to the power supply line (Vdd), and at a drain to the data bus DB.

The sense amplifier 14 is connected to the data bus DB. The sense amplifier 14 is supplied, with an activating signal (control signal) SP; and supplies a reference voltage signal SAREF.

Figure 2:
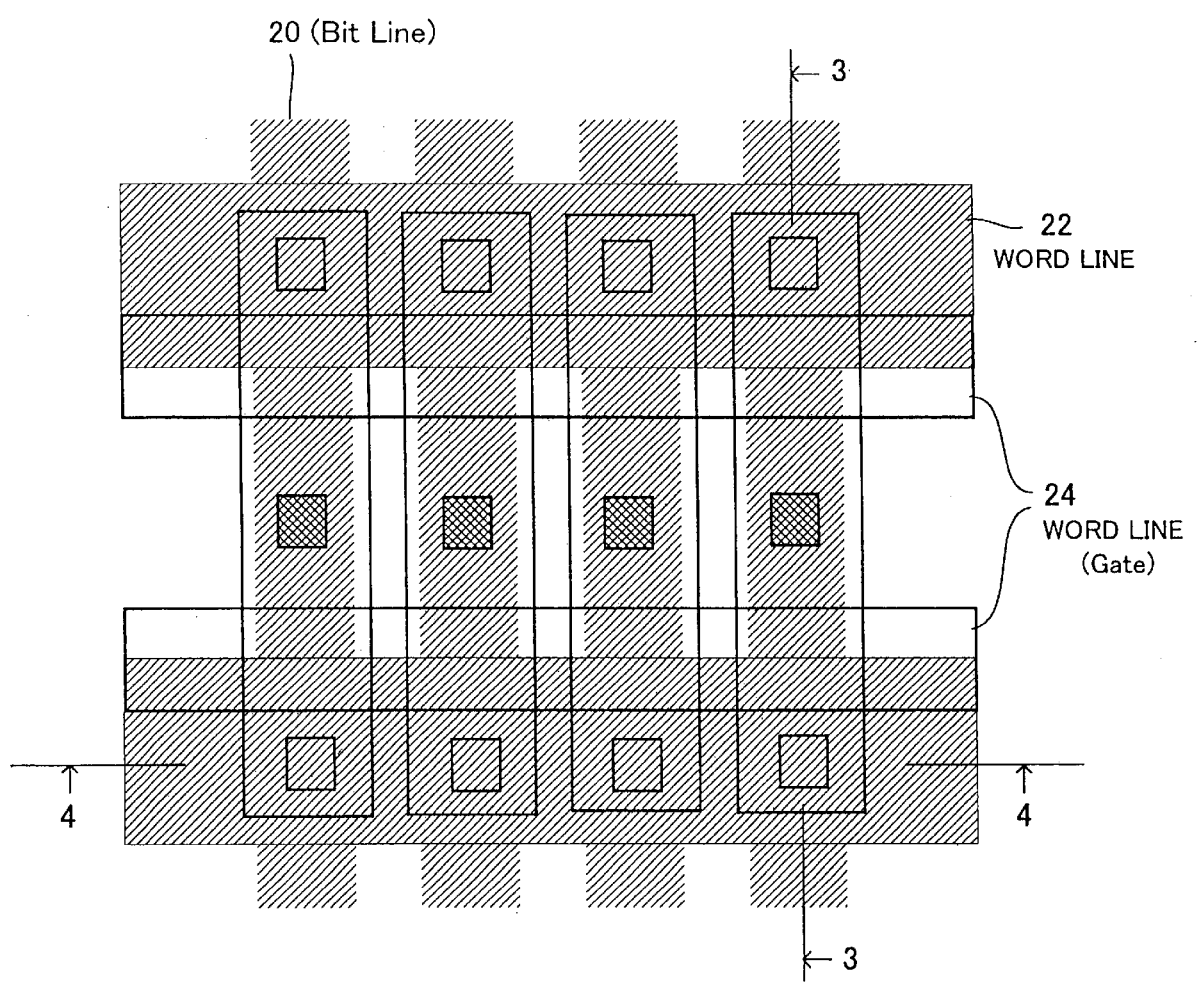
FIG. 2 is a diagram showing the layout of a memory cell array used in the mask ROM, shown in FIG. 1.
Figure 3:
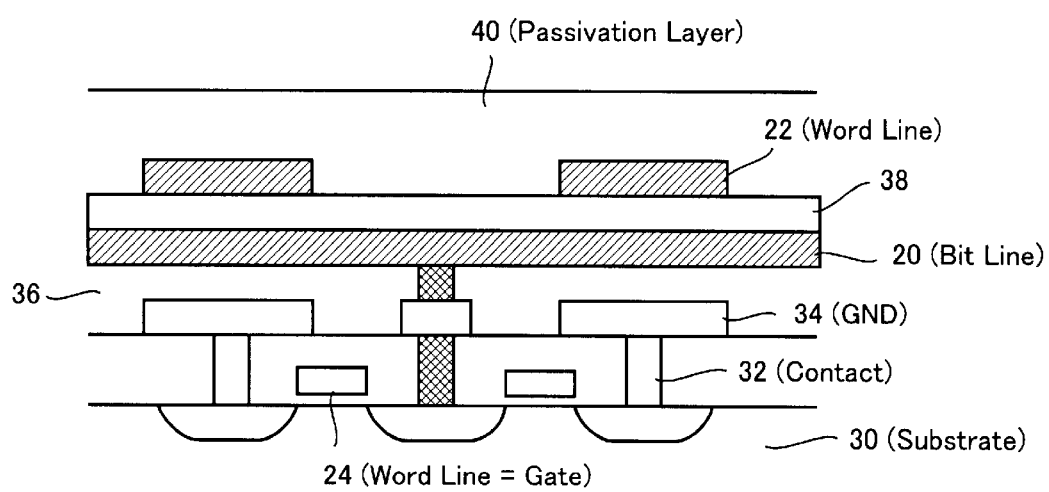
FIG. 3 is a cross-sectional view taken along line 3—3 in FIG. 2.
Figure 4:
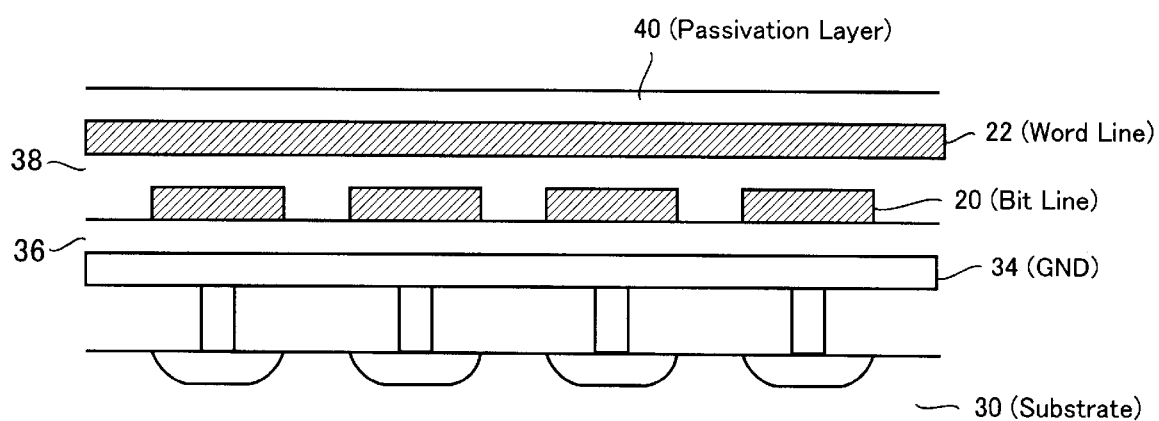
FIG. 4 is a cross-sectional view taken along line 4—4 in FIG. 2.

FIG. 2 shows part of the memory cell array 10; and FIGS. 3 and 4 are cross-sectional views taken along lines 3—3 and 4—4 in FIG. 2, respectively. In fabrication, as shown in these figures, gates 24 of the MOS transistors N1–N8 and contacts 32 are formed on a semiconductor substrate 30. Next, ground lines 34 are formed as a first metal layer. Subsequently, a first insulating layer 36 is formed over the first metal layer (34), and bit lines 20 are formed as a second metal layer on the first insulating layer 36. Next, a second insulating layer 38 is formed over the second metal layer (20), and word lines 22 (WL0–WLn) are formed as a third metal layer on the second insulating layer 38. Subsequently, a passivation layer 40 is formed over the third metal layer (22).

"As described above, according to the preferred embodiment, the bit lines 20 (BL0 to BL3) are formed as the second metal layer, which is not the uppermost layer. The passivation layer 40 has a higher dielectric constant (permitivity) as compared to the insulating layers 36 and 38. As a result, parasitic capacitance C1 to C3 between adjacent two bit lines is reduced; and therefore, cross-talk type of noise is reduced. Consequently, the ROM operates with a higher reliability."

Figure 5:
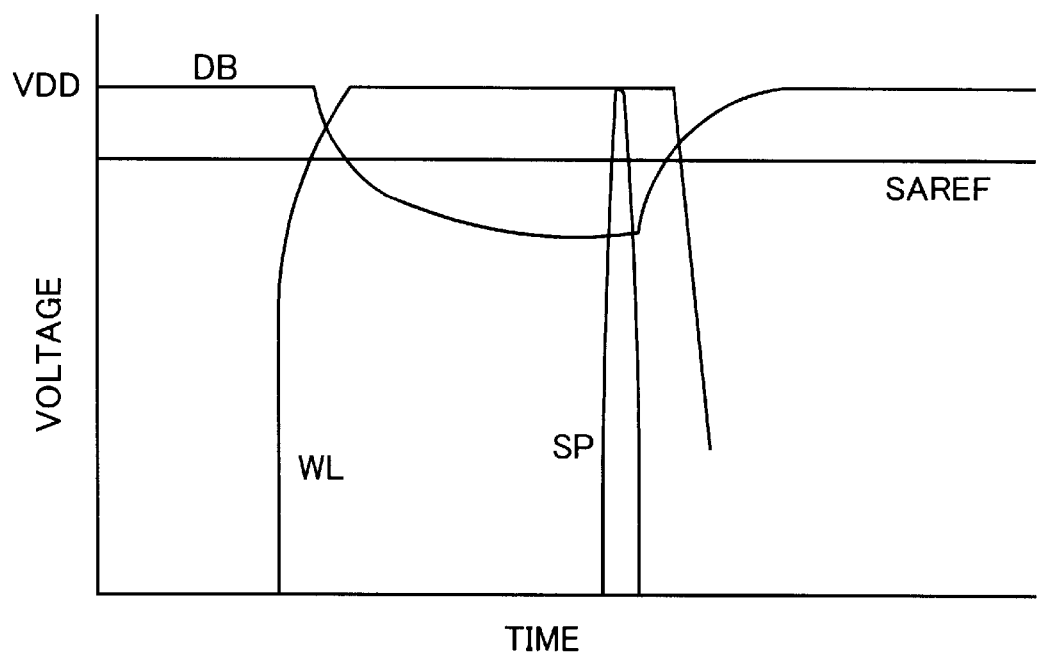
FIG. 5 is a graph showing the normal operation of a mask ROM.

FIG. 5 shows variation of voltage at the data bus DB with passage of time in the case when "L" data are read from the ROM. In operation, the bit lines BL0 to BL3 are pre-charged with VDD (power supply voltage) in accordance with the function of the PMOS transistors P1 to P4 in the selector circuit 12. For starting reading operation, the signal PRE is turned low to high, Y-decode signals y0–y3 driving PMOS transistors which are connected to bit lines to be accessed are only turned high to low. As a result, bit lines to be accessed are connected to the power supply VDD only through the PMOS transistor P9, while the other bit lines are in a floating condition. After that, data stored at the memory cells are read out. As shown in FIG. 5, when the word line WLn is selected (turned to high) and the Y-decode signal y0 is turned to low (PMOS transistor P5 becomes active), the data bus voltage DB is turned to low state in response to the operation of the MOS transistor N1. When the data bus voltage DB becomes lower than the reference level (SAREF), L data can be read out by supplying the activation signal SP to the sense amplifier 14.

Figure 6:
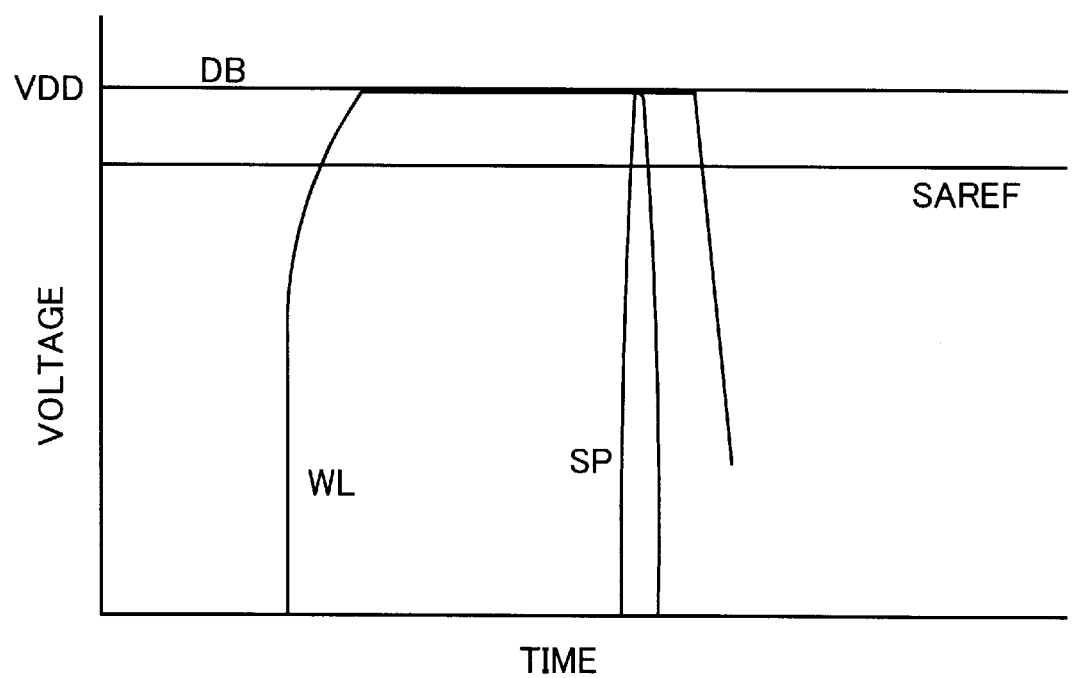
FIG. 6 is a graph showing the normal operation of a mask ROM.

As shown in FIG. 6, when the Y-decode signal y1 is in a low condition (PMOS transistor P6 is active), the source of the MOS transistor N2 is in a floating state. Therefore, any of the bit lines BL0 to BL3 and data bus DB are not changed in voltage. As a result, the data bus voltage DB never becomes lower than the reference level SAREF, and H data can be read out by supplying the activation signal SP to the sense amplifier 14.

Figure 7:
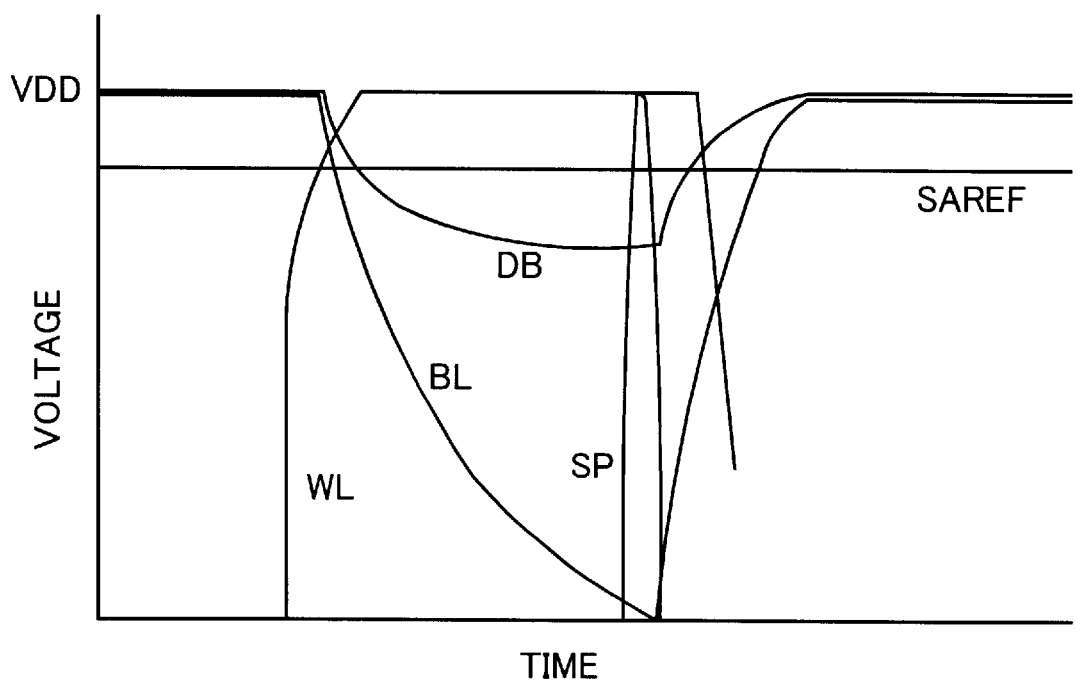
FIG. 7 is a graph showing an error operation of a conventional mask ROM.

However, when parasitic capacitances C1 to C3 existing between adjacent two bit lines BL0 to BL3 are increased, an operation error may be made when H data are read out from the memory cell array 10. FIG. 7 shows such an error operation. When the word line WLn turns to high, the bit lines other than the bit lines to be accessed are in a floating state. In this situation, if the MOS transistors N1, N3 and N4 in the memory cell array 10 store L data, the bit lines BL0, BL2 and BL3 are turned to low "L". When the bit lines BL0, BL2 and BL3 are turned to low "L", the voltage level of the bit line BL1, which should hold high level, is decreased in accordance with the parasitic capacitances (coupling capacitances) C1 to C3. When the signal SP is supplied to the sense amplifier 14, and the data bus voltage DB is lower than the reference level SAREF, a low "L" data may be read out in error.

What is claimed is:

1. A semiconductor memory device, which is fabricated to have a multi-layered structure on a semiconductor substrate, comprising:

ground lines, which are formed in a first conductive layer;

bit lines, which are formed in a second conductive layer;

a first insulating layer formed between the first and second conductive layers;

word lines, which are formed in a third conductive layer;

a second insulating layer formed between the second and third conductive layers; and a passivation layer formed over and in direct contact with the third conductive layer, a dielectric constant of the passivation layer being higher than dielectric constants of the first and second insulating layers, wherein the first conductive layer is a lowermost conductive layer of the first to third conductive layers, the third conductive layer is an uppermost conductive layer of the first to third conductive layers, and the second conductive layer is arranged between the first and third conductive layers in a vertical direction, and wherein the ground lines extend in a direction orthogonal to a direction of the bit lines.

2. A semiconductor memory device according to claim 1, further comprising a lowermost insulating layer formed on the semiconductor substrate, wherein the first conductive layer is formed on the lowermost insulating layer.

3. A semiconductor memory device according to claim 1, wherein the memory device is a mask ROM (Read Only Memory) comprising a NOR type of memory cell array.

4. A semiconductor memory device according to claim 1, wherein the word lines extend in the direction orthogonal to the direction of the bit lines.

5. A mask ROM, which is fabricated to have a multi-layered structure on a semiconductor substrate, comprising:

a lowermost insulating layer formed on the semiconductor substrate;

a first metal layer for ground lines which is formed on the lowermost insulating layer;

a first insulating layer formed on the first metal layer;

a second metal layer for bit lines, which is formed on the first insulating layer;

a second insulating layer formed on the second metal layer;

a third metal layer for word lines, which is formed on the second insulating layer; and a passivation layer formed over the third metal layer, a dielectric constant of the passivation layer being greater than dielectric constants of the first and second insulating layers, wherein the first metal layer is a lowermost layer of the first through third metal layers and wherein the ground lines extend in a direction orthogonal to a direction of the bit lines.

6. A mask ROM according to claim 5, wherein the passivation layer directly contacts the third metal layer.

7. A mask ROM according to claim 5, wherein the word lines extend in the direction orthogonal to the direction of the bit lines.

8. A mask ROM according to claim 7, wherein the word lines are aligned over the ground lines.

9. A semiconductor memory device according to claim 4, wherein the word lines are aligned over the ground lines.

* * * * *